United States Patent [19]

Matsuzawa et al.

[11] Patent Number: 5,321,402
[45] Date of Patent: Jun. 14, 1994

[54] ANALOG-TO-DIGITAL CONVERSION METHOD AND DEVICE

[75] Inventors: Akira Matsuzawa, Neyagawa; Haruyasu Yamada, Hirakata, both of Japan

[73] Assignee: Matsushita Electric Industrial Co., Ltd., Osaka, Japan

[21] Appl. No.: 983,255

[22] Filed: Nov. 30, 1992

Related U.S. Application Data

[63] Continuation of Ser. No. 504,833, Apr. 5, 1990, abandoned.

[30] Foreign Application Priority Data

Apr. 11, 1989 [JP] Japan ................... 1-91344

[51] Int. Cl.$^5$ .................. H03M 1/14; H03M 1/34; H03M 1/44
[52] U.S. Cl. ................... 341/161; 341/155; 307/38; 307/39; 330/252
[58] Field of Search ............ 341/155, 159, 156, 161, 341/158, 160; 307/38, 39, 11, 43, 18; 330/252, 253, 277, 285, 261, 199

[56] References Cited

U.S. PATENT DOCUMENTS

| | | | |
|---|---|---|---|
| 4,599,602 | 7/1986 | Matsuzawa et al. | 341/161 |
| 4,866,443 | 9/1989 | Okada et al. | 341/159 |
| 4,866,444 | 9/1989 | Nejime et al. | 341/159 |
| 4,910,518 | 3/1990 | Kim et al. | 341/155 |
| 4,912,469 | 3/1990 | Van De Grift et al. | 341/155 |
| 4,918,451 | 4/1990 | Ando et al. | 341/159 |
| 4,918,453 | 4/1990 | Kimura et al. | 341/155 |
| 4,924,227 | 5/1990 | Mangelsdorf | 341/159 |

OTHER PUBLICATIONS

T. Takemoto et al., "A Fully Parallel 10 Bit A/D Converter with Video Speed" IEEE J. Solid–State Circuits, vol. SC–17, pp. 1133–1138, 1982.

T. Shimizu et al., "A 10-bit 20MHz Two-Step Parallel A.D Converter with Internal S/H," IHEE J. Solid-State Circuits vol. SC-24, pp. 13-20, Feb. 1989.

Primary Examiner—William M. Shoop, Jr.
Assistant Examiner—H. Kim
Attorney, Agent, or Firm—Stevens, Davis, Miller & Mosher

[57] ABSTRACT

Analog-to-digital conversion method and device using triangular vertex solution are disclosed. The method includes the steps of defining a first and a second boundary value between which a quantity to be analog-to-digital converted resides, multiplying a difference between the first boundary value and the quantity to be converted by a first coefficient to produce a first physical quantity, multiplying a difference between the second boundary value and the quantity to be converted by a second coefficient to produce a second physical quantity, comparing the first and second physical quantities to obtain a comparison result, and logically converting the comparison result into a digital value. The device includes a first differential converting circuit for generating one or more voltages, which are produced by multiplying a potential difference between a first reference voltage and an input analog voltage by a chain of first coefficients, a second differential converting circuit for generating one or more voltages, which are produced by multiplying a potential difference between a second reference voltage and the input analog voltage by a chain of second coefficients, and a comparator circuit for comparing output voltages of the first and second differential converting circuits, with the output of the comparator circuit being logically converted into a digital value.

7 Claims, 11 Drawing Sheets

ANALOG-TO-DIGITAL CONVERSION METHOD AND DEVICE

This application is a continuation of application Ser. No. 07/504,833, filed Apr. 5, 1990 (abandoned).

BACKGROUND OF THE INVENTION

1. Field of the Invention

The present invention relates to an analog-to-digital (referred to as A/D) conversion method and device which serves to convert an analogue value into a digital value.

2. Description of the Prior Art

A conventional analog-to-digital conversion device is schematically shown in FIG. 2. An analogue input signal 1 is applied to a common input terminal of a first comparator chain 2. The other input terminals of the first comparator chain 2 are connected to a first reference voltage generating means 3. The reference voltages generated in the means 3 are respectively applied to the other input terminals of chain 2. The outputs of the first comparator chain are logically converted by a first logic circuit 4 for providing upper-digits of the converted value. Additionally, the outputs of the first comparator chain are sent to a digital-to-analogue conversion section 5 in which they are converted into an analogue signal. The resulting analogue signal is sent to a subtracter 6 in which a potential difference between the analogue signal is subtracted by the origianl analogue input signal. Then, the subtracted signal is sent to common input terminals of a second comparator chain 8. The other input terminals of the second comparator chain 8 are connected to a second reference voltage generating means 7 so that the reference voltages generated in the means 7 are respectively applied to those other input terminals. The comparing outputs of the second comparator chain are logically converted by a second logic circuit 9 for providing lower-digits of the converted value.

The conventional A/D conversion device, however, is likely to generate a large conversion error due to instability of the gain of the subtracter 6, insufficient precision of reference voltages generated in the second reference voltage generating means 7, or variation of the offset voltages in the first comparator chain 2. It has been thus difficult to carry out the conversion quite accurately. The present invention is designed to overcome this difficulty. It is, therefore, an object of the invention to provide an A/D conversion method and device which is capable of performing high-accuracy A/D conversion as well as a comparator circuit which implements the A/D conversion device.

SUMMARY OF THE INVENTION

According to a first aspect of the invention, an A/D conversion method includes defining a region between a first boundary value and a second boundary value as a reference range and comparing a first physical quantity, which is produced by multiplying a difference between the first boundary value and a quantity to be A/D converted by a first coefficient, with a second physical quantity, which is produced by multiplying a difference between the second boundary value and the quantity to be A/D converted by a second coefficient, for the purpose of providing a converted digital value.

According to a second aspect of the invention, an A/D conversion method includes defining a region between a first boundary value and a second boundary value as a reference range and comparing a plurality of first physical quantities, which are produced by multiplying a difference between the first boundary value and a quantity to be A/D converted by a chain of first coefficients with a plurality of second physical quantities, which are produced by multiplying a difference between the second boundary value and the quantity to be A/D converted by a chain of second coefficients, for the purpose of providing a converted digital value.

According to a third aspect of the invention, an A/D conversion device comprises a first differential converting circuit for generating one or more output voltages, which are produced by multiplying a potential difference between a first reference voltage and an input analogue voltage by a chain of first coefficients, a second differential converting circuit for generating one or more output voltages, which are produced by multiplying a potential difference between a second reference voltage and the input analogue voltage by a chain of second coefficients, and a comparator circuit for comparing output voltages of the first differential converting circuit and output voltages of the second differential converting circuit, the comparing outputs of the comparator circuit being logically converted into a converted digital value.

According to a fourth aspect of the invention, an A/D conversion device comprises a first differential converting circuit for converting a potential difference between a first reference voltage and an input analogue voltage into a first differential current, a first pair of load resistor chains served as load of the differential current, each of the chains having one or more resistors connected in series, a second differential converting circuit for converting a potential difference between a second reference voltage and the input analogue voltage into a second differential current, a second pair of load resistor chains served as load of the differential current, each of the chains having one or more resistors connected in series, and a comparator circuit for comparing one or more potential differences between one or more taps of the first pair of load resistor chains with one or more potential differences between one or more taps of the second pair of load resistor chains, the comparing outputs of the comparator circuit being logically converted into a digital value.

According to a fifth aspect of the invention, an A/D conversion device comprises a reference voltage generating means for generating a plurality of reference voltages, a plurality of differential converting circuits numbered in the order of the magnitudes of the reference voltages and having respective one input terminal connected to the reference voltages in sequence and respective other input terminals connected to an analogue input signal in common to convert the potential difference between the inputs into respective differential pairs of currents a first and a second pair of load resistor chains each chain having one or more resistors connected in series and each pair of load resistor chains serving as a pair of loads on the differential pairs of currents, a first comparator chain for comparing said analogue input signal with the plurality of reference voltages, a switching means for selectively supplying the output currents of specific even-numbered differential converting circuits and the output currents of the adjacent odd-numbered differential converting circuits to the first pair of load resistor chains and the second pair of load resistor chains depending on the comparing output of the first comparator chain, and a second comparator chain for comparing one or more potential differences between one or more taps of the first pair of load resistor row with one or more potential differences between one or more taps of the second pair of load resistor row, wherein the comparing outputs of the first and the second comparator circuits are logically converted into a digital value.

According to a sixth aspect of the invention, an A/D conversion device comprises a first differential converting circuit for converting a first input potential difference into a first differential circuit, a second differential converting circuit for converting a second input potential difference into a second differential current, and a comparator circuit for supplying both the first differential current and the second differential current into a pair of loads and generating a comparing output according to the magnitude of a difference between the first input potential difference and the second input potential difference.

Next, the functions of those aspects of the invention will be described.

According to the first aspect, the A/D conversion method is provided to define a region placed between a first boundary value and a second boundary value as a reference range and comparing a physical quantity, which is produced by multiplying a difference between the first boundary value and a converted quantity by a first coefficient, with another physical quantity, which is produced by multiplying a difference between the second boundary value and the converted quantity by a second coefficient, for the purpose of providing a converted digital value. Unlike the conventional A/D conversion method, hence, the present method makes it possible to use as a reference value a middle value of the region placed between the first boundary value and the second boundary value without having to divide the region placed between the first boundary value and the second boundary value in advance and to form a reference value.

According to the second aspect, the A/D conversion method is provided to define a region placed between a first boundary value and a second boundary value as a reference range and comparing a plurality of physical quantities, which are produced by multiplying a difference between the first boundary value and a converted quantity by a chain of first coefficients, with another plurality of physical quantities, which are produced by multiplying a difference between the second boundary value and the converted quantity by a chain of second coefficients, for the purpose of providing a converted digital value. Unlike the conventional A/D conversion method, hence, the present method makes it possible to use as reference values a plurality of middle values in the region placed between the first and the second boundary values for implementing high resolution of the A/D conversion without having to divide the region placed between the first boundary value and the second boundary value in advance and to form a reference value.

According to the third aspect, the use of the differential converting circuit or a plurality of differential converting circuit having respective amplification gain factors makes it possible to implement an A/D conversion device embodying the A/D conversion method according to the first and the second aspects.

According to the fourth aspect, the A/D conversion device employs the differential conversion circuit for converting a potential difference between a reference voltage and an input analogue voltage into a differential current and a pair of load resistor chains served as the load of the differential current and having one or more resistors connected in series. A pair of load resistors having one or more resistors connected in series are enabled to pass the same current, thereby the output voltage with the amplification gain factor given in proportion to the resistances of the load resistors being provided. The use of simple construction thus makes it possible to implement an A/D converting device embodying the A/D converting method according to the first and the second aspects.

According to the fifth aspect of the invention, a serial-parallel type A/D converter can be arranged by a plurality of differential converting circuits and a switching means for selectively supplying the output currents of those differential converting circuits into the first pair of load resistors and the second pair of load resistors. The serial-parallel type A/D converter requires far less circuit scale and power consumption than the parallel type A/D converter. Also, since the circuit system has a gain by having a larger load resistance, the required accuracy of the second comparator circuit is relaxed, thereby achieving high accuracy. In addition, unlike the conventional serial-parallel type A/D converter, the present invention does not include a fixed reference voltage and divides a lower-digit reference voltage range at a given ratio for forming each reference voltages of the lower-digit comparators. Even if, hence, a lower-digit reference voltage range is varied according to an offset voltage error of the differential converting circuit, the resulting A/d conversion device can achieve excellent differential non-linearity and high accuracy.

According to the sixth aspect, the lower-digit comparator used in the A/D conversion device serves to describe the differential currents of the first and the second differential converting circuits with a monotonous function of the first and the second input potential differences and to supply both the first and second differential currents to a pair of loads. Hence, the differential currents are linearly added, resulting in the comparing output becoming reverse in its polarity at a ratio given between the first and the second input potential differences.

BRIEF DESCRIPTION OF THE DRAWINGS

FIG. 6 is a schematic diagram showing an A/D conversion device according to fifth embodiment of the invention;

DESCRIPTION OF THE PREFERRED EMBODIMENTS

Embodiment 1

Figure 1:
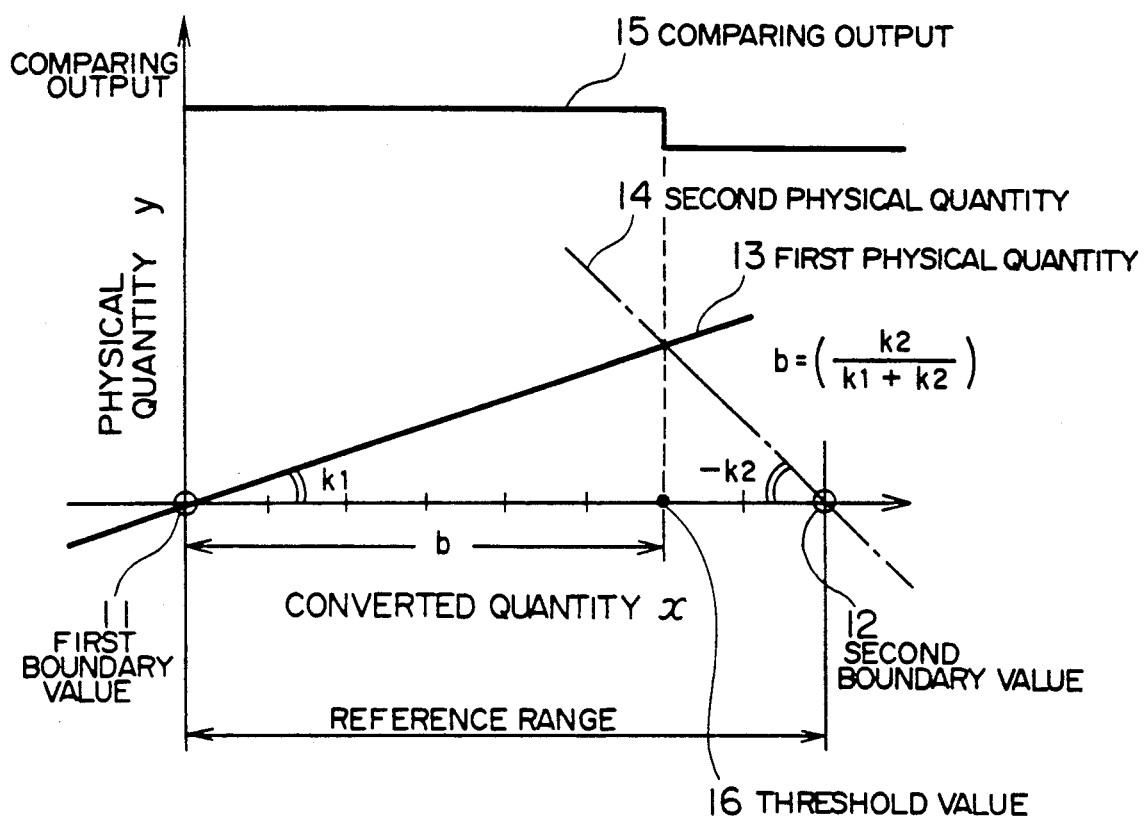
FIG. 1 is an explanation view showing an A/D conversion method according to a first embodiment of the invention.

A first embodiment of the invention, unlike the conventional A/D conversion method, provides an A/D conversion method which is capable of using as threshold values the reference values given by dividing an optionally chosen reference range, without having to prepare the reference values in advance. FIG. 1 is an explanation view showing an A/D conversion method according to the first embodiment of the invention. As shown, a first physical quantity y1 (13) is a result of multiplying a difference between a first boundary value $x_0$ (11) and a converted quantity x by a first coefficient k1. A second physical quantity y2 (14) is a result of multiplying a difference between a second boundary value $x_1$ (12) and the converted quantity x by a second coefficient −k2. For simplification, assuming that the reference range is normalized as 1, the first boundary value 11 is 0, and the second boundary value 12 is 1, the first physical quantity y1 (13) and the second physical y2 (14) are expressed by the equation;

$$y1 = k1 \cdot x \quad (1a)$$

$$y2 = -k2(x-1) \quad (1b)$$

$$b = k2/(k1+k2) \quad (1c)$$

In case two coefficients k1 and k2 are selected from (1c), the first physical quantity y1 (13) is equal to the second physical quantity y2 (14) at a given value existing in the reference range. The magnitudes of both quantities are reversed near the given value (threshold value) 16. By comparing these two quantities, it is possible to implement A/D conversion as shown in a comparing output in FIG. 1. In a special instance, if the two coefficients k1 and k2 become equal to each other, it is also possible to implement one-digit conversion of binary numbers.

Embodiment 2

Next, a description will be directed to a second embodiment of the invention.

Figure 3:
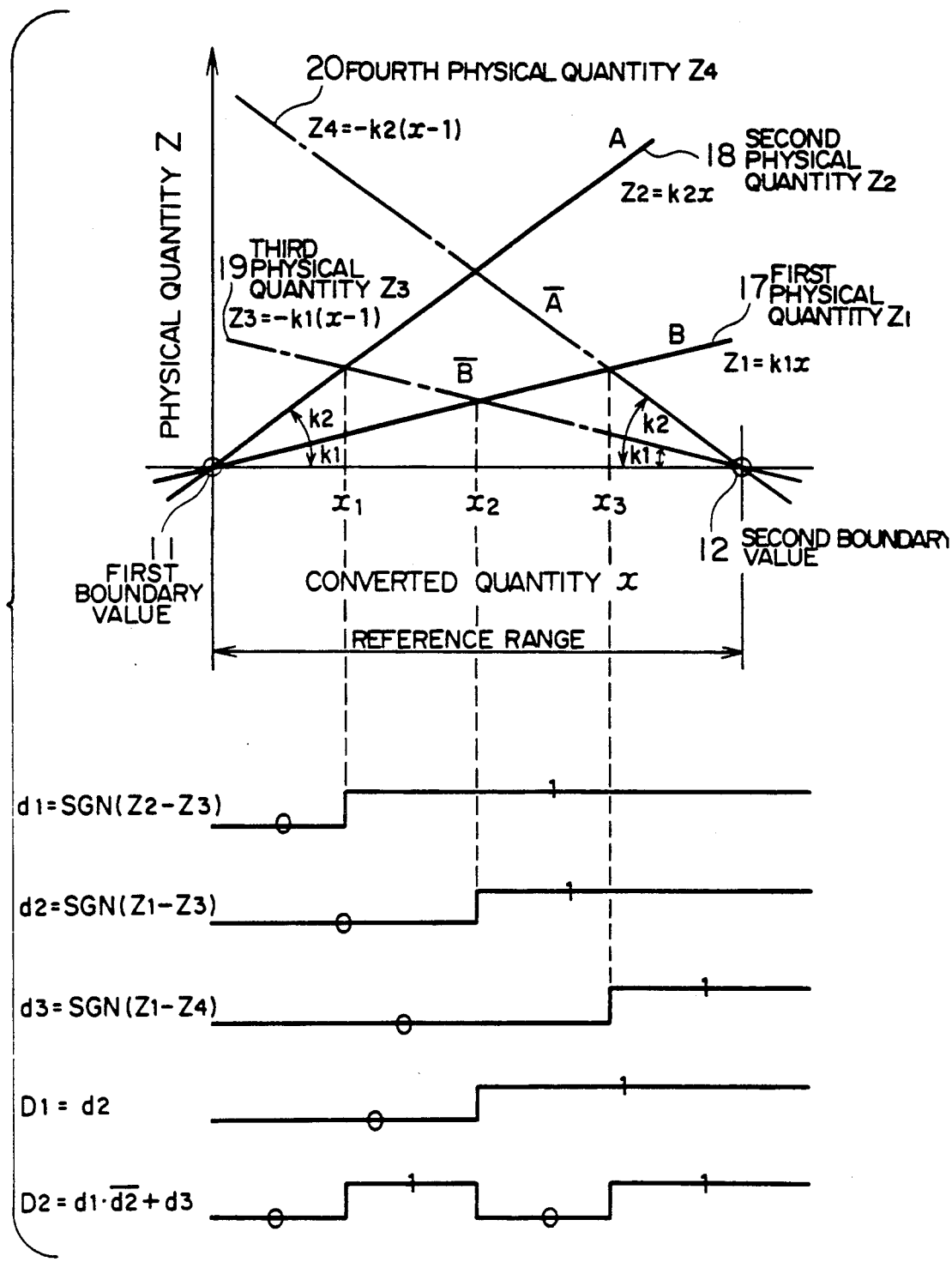
FIG. 3 is an explanation view showing an A/D conversion method according to a second embodiment of the invention.

FIG. 3 is an explanation view showing an A/D conversion method according to the second embodiment of the invention. A first physical quantity Z1 (17) is a result of multiplying a difference between the first boundary value 11 and a converted quantity x by a first coefficient k1. A second physical quantity Z2 (18) is a result of multiplying a difference between a first boundary value 11 and the converted quantity x by a second coefficient k2. A third physical quantity Z3 (19) is a result of multiplying a difference between the second boundary value 12 and the converted quantity x by a third coefficient −k1. A physical quantity Z4 (20) is a result of multiplying a difference between the second boundary value 12 and the converted quantity x by a fourth coefficient −k2. For simplification, assuming that the reference range is normalized as 1, the first boundary value 11 is zero (0), and the second boundary value 12 is one (1), those physical quantities can be represented by the equations of;

$$Z1 = k1x \quad (2a)$$

$$Z2 = k2x \quad (2b)$$

$$Z3 = -k1(x-1) \quad (2c)$$

$$Z4 = -k2(x-1) \quad (2d)$$

Using the foregoing equations, Z2−Z3, Z1−Z3, Z1−Z4, and the roots of these equations x1, x2, and x3 can be derived as follows:

$$Z2-Z3 = (k1+k2)x - k1, \quad x1 = k1/(k1+k2) \quad (3a)$$

$$Z1-Z3 = 2k1x - k1, \quad x2 = 0.5 \quad (3b)$$

$$Z1-z4 = (k1+k2)x - k2, \quad x3 = k2/(k1+k2) \quad (3c)$$

Then, for representing the function of a comparator for converting an analogue value into a digital value, a SGN function is defined as follow:

$$SGN(x) = 1 : x \geq 0 \quad (4a)$$

$$SGN(x) = 0 : x < 0 \quad (4b)$$

Using this function, the comparing outputs d1, d2, and d3 are represented by the following equations:

$$d1 = SGN(z2 - z3) \quad \begin{aligned} &= 1 : x \geq x1 \\ &= 0 : x < x1 \end{aligned} \quad (5a)$$

$$d2 = SGN(z1 - z3) \quad \begin{aligned} &= 1 : x \geq x2 \\ &= 0 : x < x2 \end{aligned} \quad (5b)$$

$$d3 = SGN(z1 - z4) \quad \begin{aligned} &= 1 : x \geq x3 \\ &= 0 : x < x3 \end{aligned} \quad (5c)$$

An assumption that the coefficients k1 and k2 are set as k2=3k1 results in x1=1.4, 2x=2/4, and x3=3/4. The comparing outputs d1, d2, and d3 thus become the comparing outputs of the A/D converter. Then, the converted outputs D1 and D2 are logically formed as follows:

$$D1 = d2, \quad D2 = d1 \cdot \overline{d2} + d3$$

It results in composing a binary 2-bit A/D converter. What is required for enhancing the resolution is to increase the number of coefficients. That is, the conventional A/D conversion method is designed so that several comparators respectively compare their reference values formed by dividing a reference range with a converted quantity, while the present A/D conversion method serves to compare some physical quantities, which are results of multiplying a difference between a first boundary value and a converted quantity by some coefficients, with some other physical quantities, which are results of multiplying a difference between a second boundary value and a converted quantity by some coefficients for the purpose of providing a digital value. Even if the comparators have less accuracy than the resulting A/D conversion accuracy, the resulting A/D conversion becomes highly accurate. Further, due to the amplification action it is possible to implement an A/D conversion method of the invention by applying a differential amplifying circuit into a system for performing second A/D conversion of a difference between an analogue value and a first reference value unlike the series-parallel type A/D converter. The resulting A/D conversion method allows an error caused in the first conversion to be relaxed, thereby realizing highly accurate conversion. This type A/D conversion method will be discussed in detail in a fifth embodiment.

Embodiment 3

Figure 4:
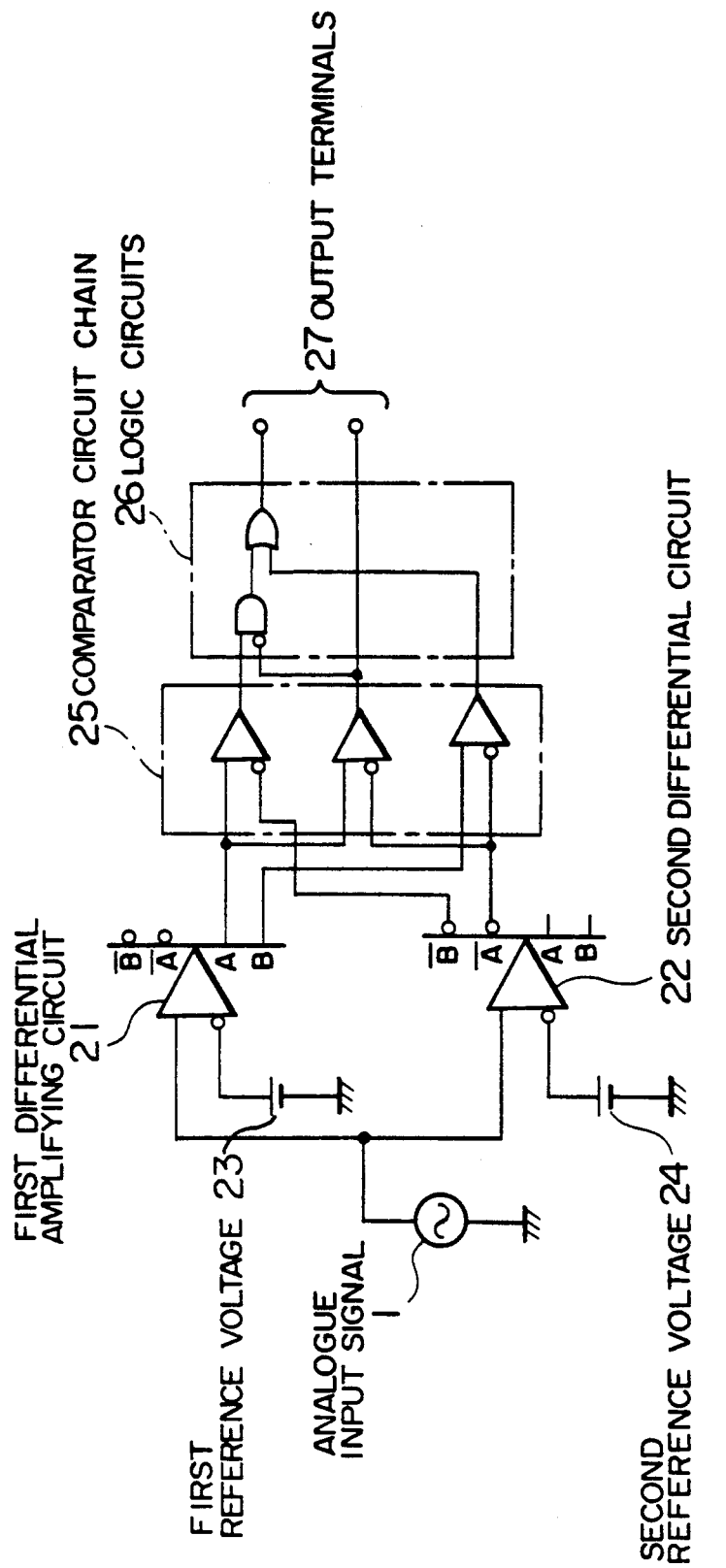
FIG. 4 is a schematic diagram showing an A/D conversion device according to a third embodiment of the invention.

Next, the third embodiment of the invention will be described with reference to FIG. 4. The third embodiment is an A/D conversion device which is a result of embodying the A/D conversion methods according to the first and the second embodiments of the invention. An analogue input signal 1 is applied to a common terminal for each one terminal of a first and a second differential amplifying circuits 21 and 22. A first reference voltage 23 is applied to the other input terminal of the first differential amplifying circuit 21. The circuit 21 serves to output at output terminals A and B a resulting voltage of multiplying the analogue input signal 1 from which the first reference voltage 23 is subtracted by the first and the second coefficients. Likewise, a second reference voltage 24 is applied to the other input terminal of the second differential amplifying circuit 22. The circuit 22 serves to output at complementary output terminals $\overline{A}$ and $\overline{B}$ a voltage produced by multiplying the analogue input signal 1 from which the second reference voltage 24 is subtracted by the first and the second coefficients. Then, a comparator circuit 25 serves to compare those output voltages with each other and the compared results are inputted to a logic circuit 26, resulting in allowing the A/D conversion output to be output at output terminals 27 of the logic circuit 26. At this time, assuming that a ratio of a first coefficient to a second coefficient is 1:3, the precise binary 2-digit conversion is carried out in a manner such that an input and output characteristics of a differential circuit are represented by the following equation:

$$V_o - V_{ob} = k(V_{in} - V_{ref}) \qquad (6a)$$

$$\overline{V}_o - V_{ob} = -k(V_{in} - V_{ref}) \qquad (6b)$$

where $V_o$ denotes an output voltage, $\overline{V}_o$ denotes a complementary output voltage, $V_{ob}$ denotes an output bias voltage, k denotes an amplification factor, $V_{in}$ denotes an input voltage, and $V_{ref}$ denotes a reference voltage.

The foregoing differential circuit can be easily composed using an operation amplifier.

Embodiment 4

Figure 5:
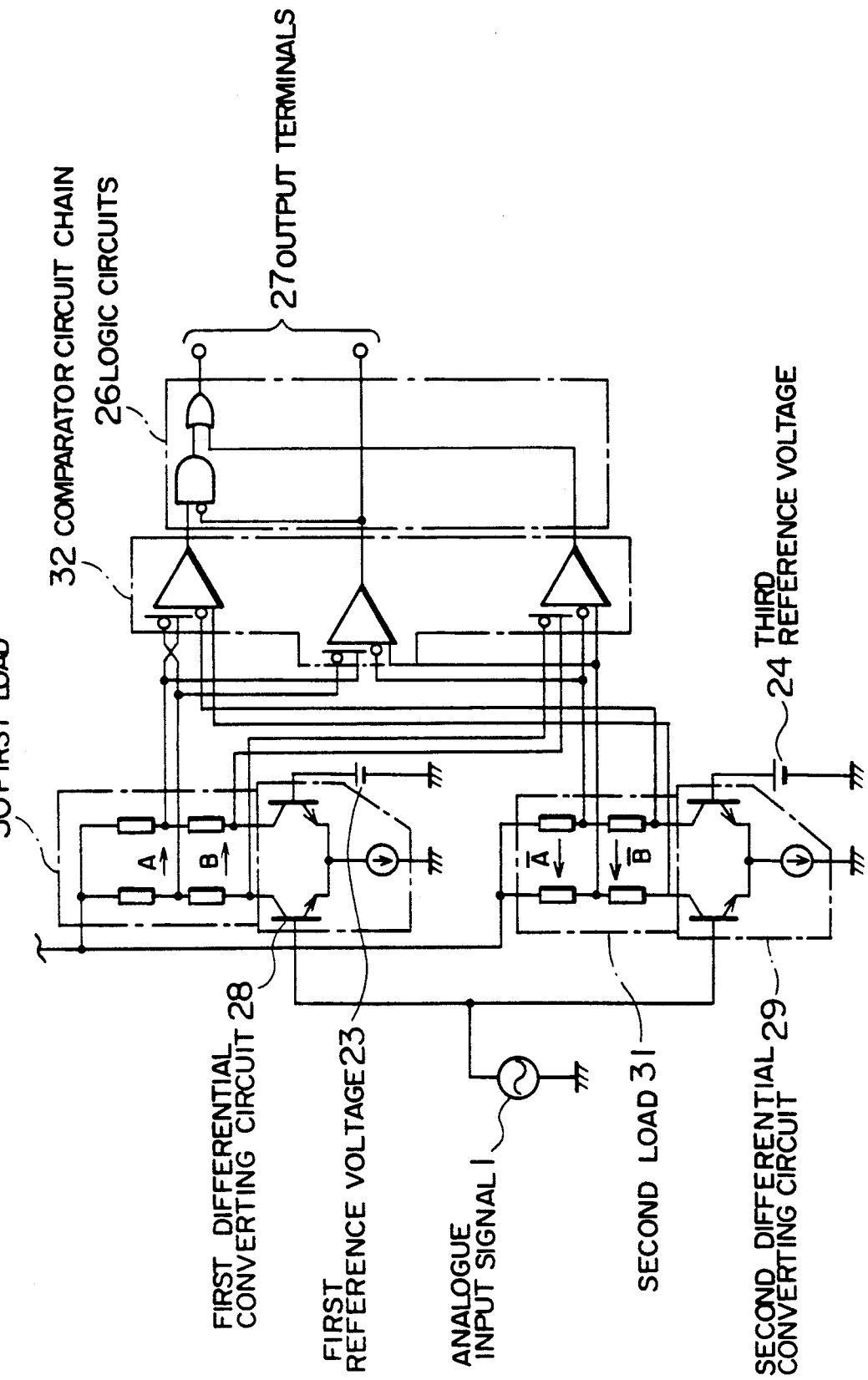
FIG. 5 is a schematic diagram showing an A/D conversion device according to a fourth embodiment of the invention.

The fourth embodiment of the invention is shown in FIG. 5. According to the present embodiment, the differential amplifying circuit described in the third embodiment is composed of a differential conversion circuit for converting a differential voltage into a differential current and a pair of load resistor chains having one or more resistors connected in series. The resulting differential amplifying circuit has a simpler construction than the amplifying circuit using an operational amplifier. In this embodiment, an analogue input signal 1 is applied to a common terminal for each one input terminal of a first and a second differential conversion circuits 28 and 29, each of which is composed of a transistor pair and a current source. A first reference voltage 23 is applied to the other input terminal of the first differential conversion circuit 28. The output current of the first differential conversion circuit 28 is supplied to a first load 30 consisting of a pair of load resistor chains, each chain having one or more resistors connected in series. The first differential conversion circuit 28 serves to output at differential output terminals A and B resulting voltages produced by multiplying the analogue input signal 1 from which the first reference voltage 23 is subtracted by a first and a second coefficients. Likewise, a second reference voltage 24 is applied to the other input terminals of the second differential conversion circuit 29. The circuit 29 serves to supply the output current to a second load 31 having a pair of load resistor chains, each chain having one or more resistors connected in series. The second differential conversion circuit 29 serves to output at the output terminals $\overline{A}$ and $\overline{B}$ the complementary outputs, which are results of multiplying the analogue input signal 1 from which the second reference voltage 29 is subtracted by a first and a second coefficients. Then, a comparator circuit 32 having a differential construction serves to compare those output voltages with each other and apply the results to a logic circuit 26, resulting in allowing A/D converted outputs to be sent out at the output terminals 27. At this time, assuming that a ratio of the resistance values of the resistors located on the power source side to that of the resistors located on the differential conversion circuit side is 1:2, the precise binary 2-digit conversion is carried out. The reason of the precise conversion will be described below. The differential conversion circuit provides the input and output characteristics represented by the following equation:

$$\Delta V_a = R1 \Delta I_o = gmR1(v_{in} - V_{ref}) \qquad (7a)$$

$$\Delta V_b = (R1 + R2)\Delta I_o = gm(R1 + e2)(V_{in} - V_{ref}) \qquad (7b)$$

where $\Delta V_a$ and $\Delta V_b$ denote differential output voltages at differential output terminals A and B, R1 denotes a resistance value of a resistor on a power source side, R2 denotes a resistance value of a resistor on a differential conversion circuit side, $\Delta I_o$ denotes a differential output current, gm denotes mutual conductance of a differential conversion circuit, $V_{in}$ denotes an input voltage, and $V_{ref}$ denotes a reference voltage.

Assuming that R1:R2=1:2 is established, $\Delta V_a:\Delta V_b=1:3$ is given. It results in tripling a proportional coefficient between two outputs. Hence, the precise binary 2-bit conversion is carried out on the principle described in the second embodiment of the invention. Unlike the normal comparators, this present comparator circuit has to compare the magnitude of one differential voltage with the magnitude of another differential voltage. The concrete construction of the comparator circuit will be described in a sixth embodiment of the invention. According to the present embodiment, even if there are required a number of outputs having respective differential gains, a quite simple circuit can be composed, because what is needed for the requirement is to commonly use one differential conversion circuit and to increase the number of resistors contained in a pair of load resistor chains without having to provide a number of differential amplifiers.

Embodiment 5

Figure 2:
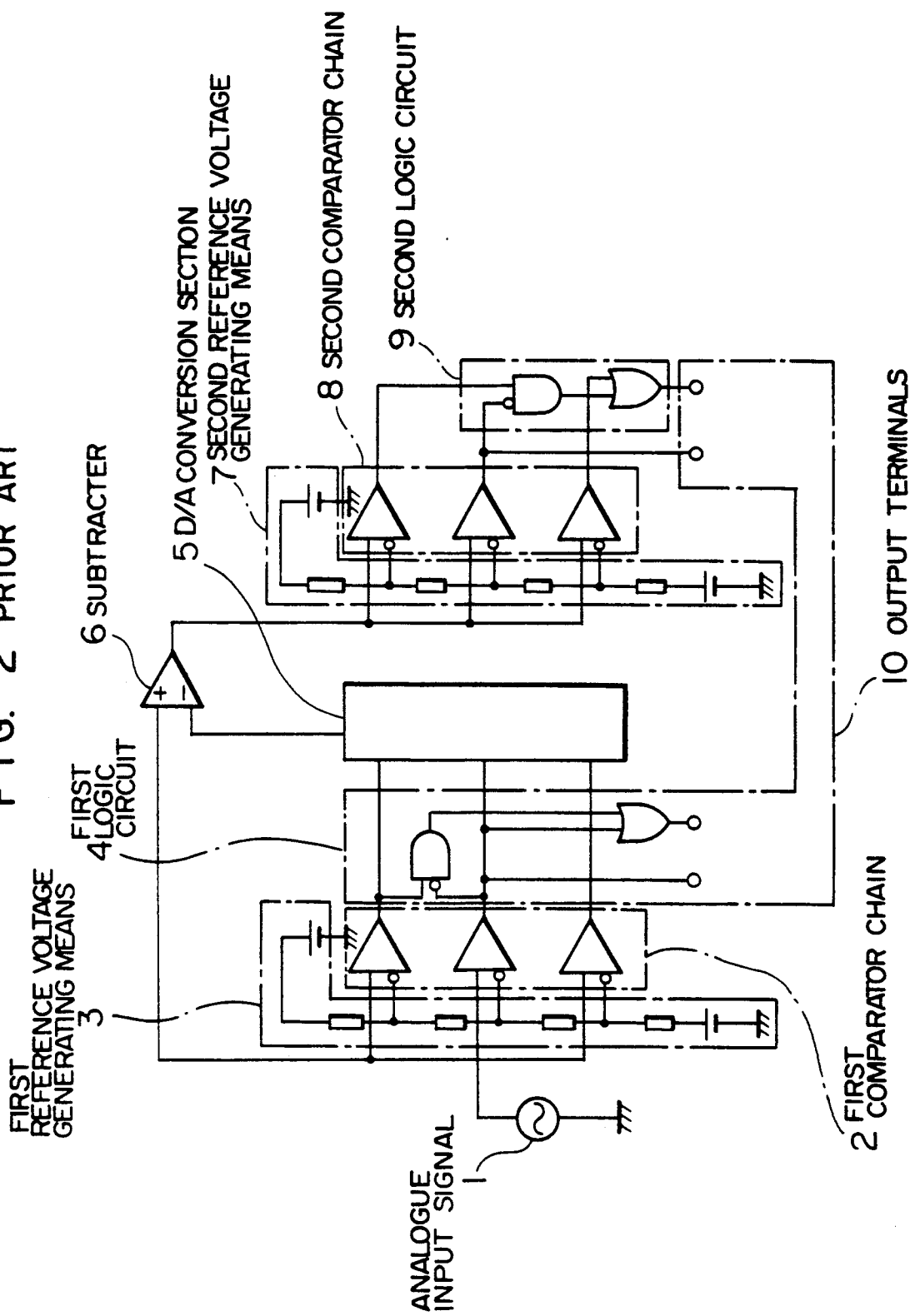
FIG. 2 is a schematic diagram showing a conventional A/D conversion device.
Figure 6:
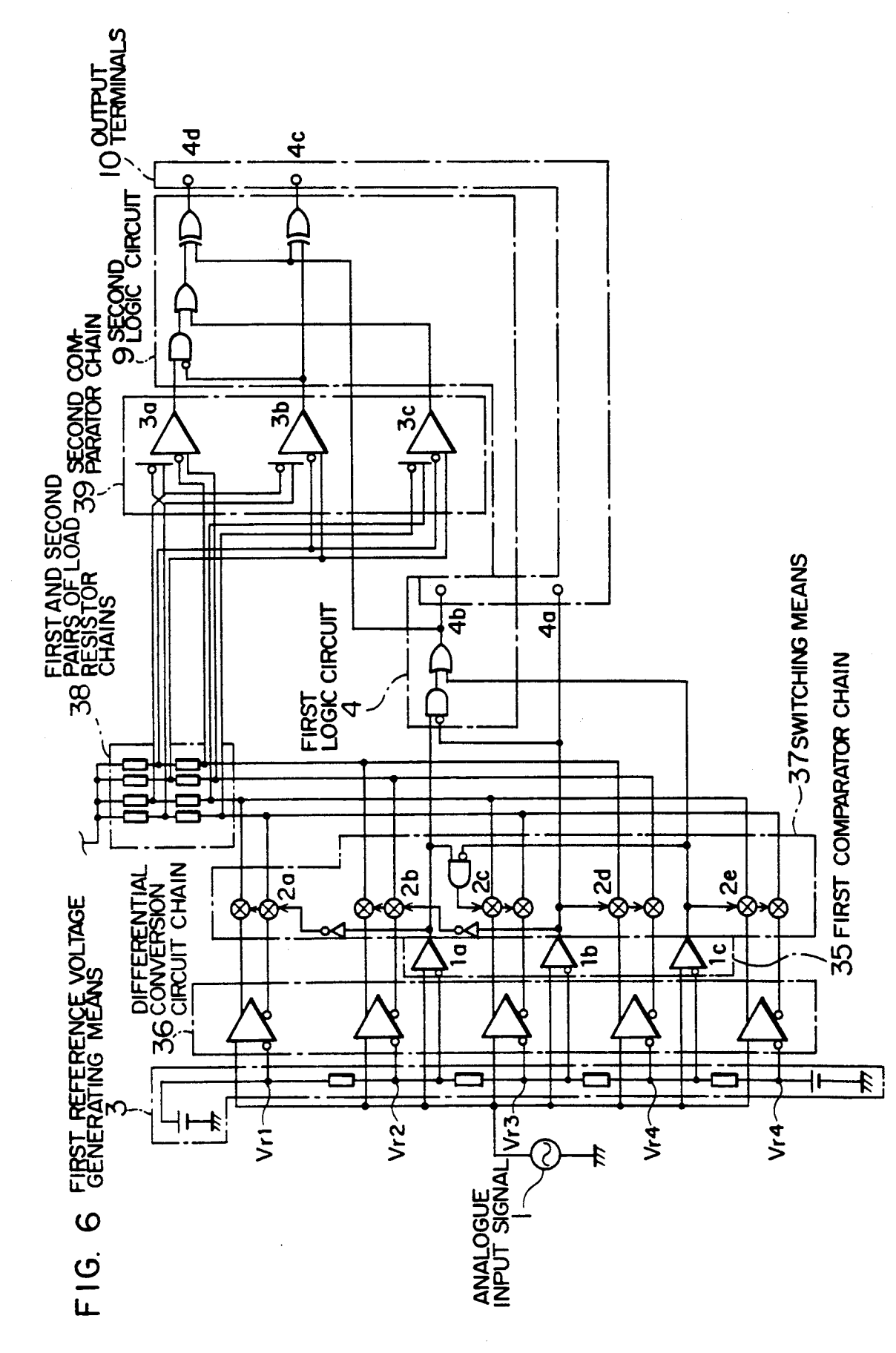
Figure 7:
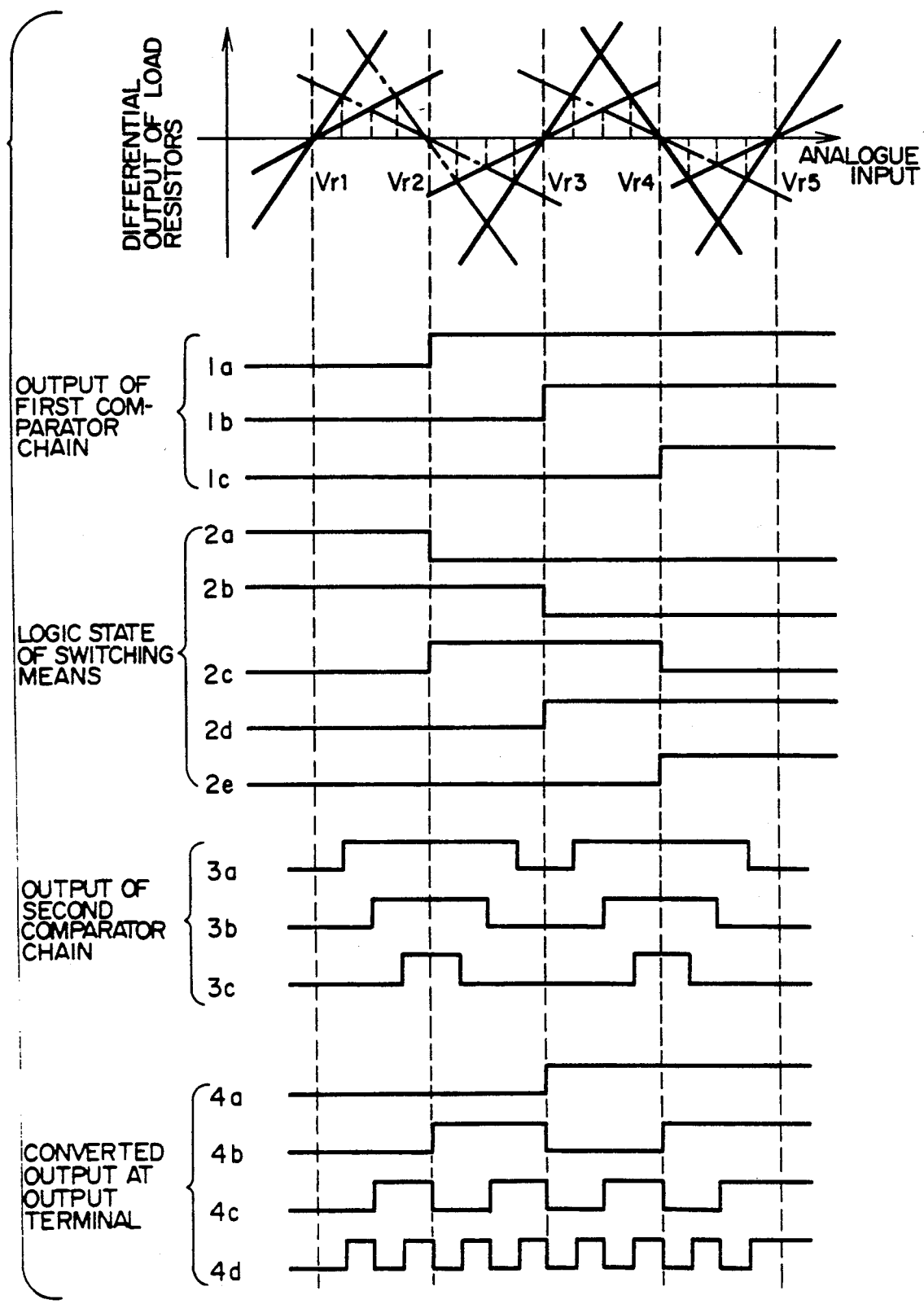
FIG. 7 is an explanation view showing the operation of the A/D conversion device according to the fifth embodiment of the invention.
Figure 8A:
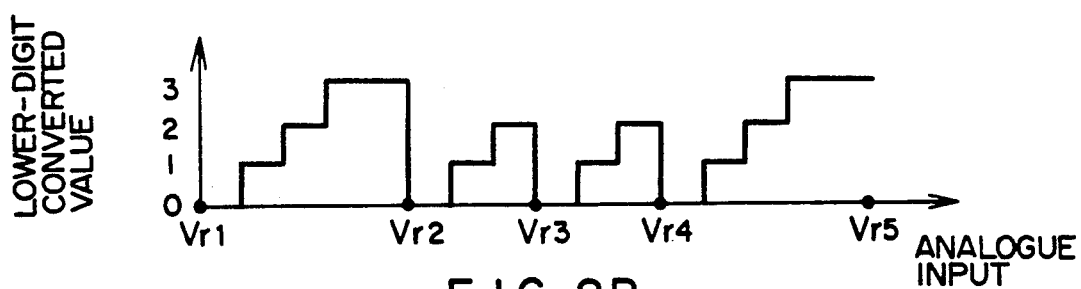
FIGS. 8A, 8B, 9A and 9B are explanation views showing the operation of the A/D conversion device according to the fifth embodiment of the invention.
Figure 8B:
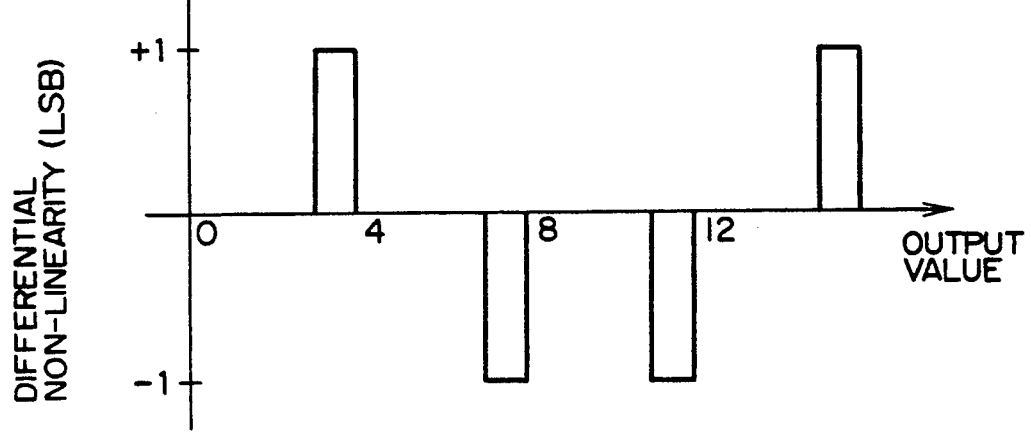
Figure 9A:
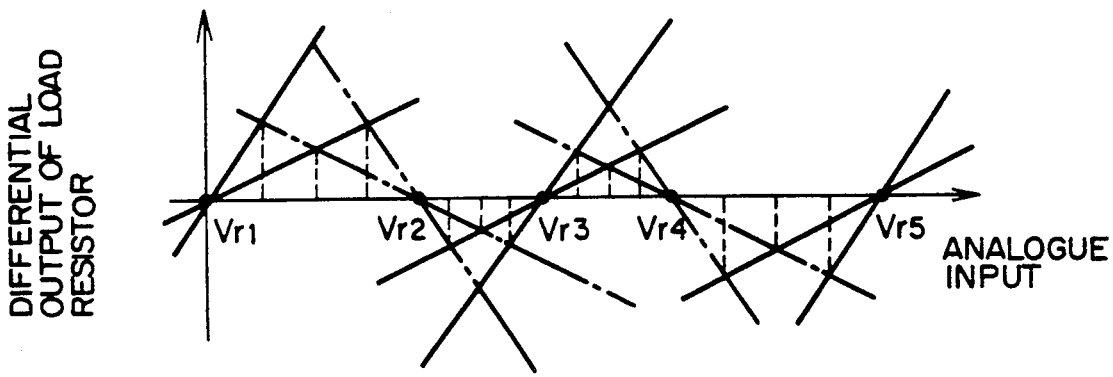
Figure 9B:
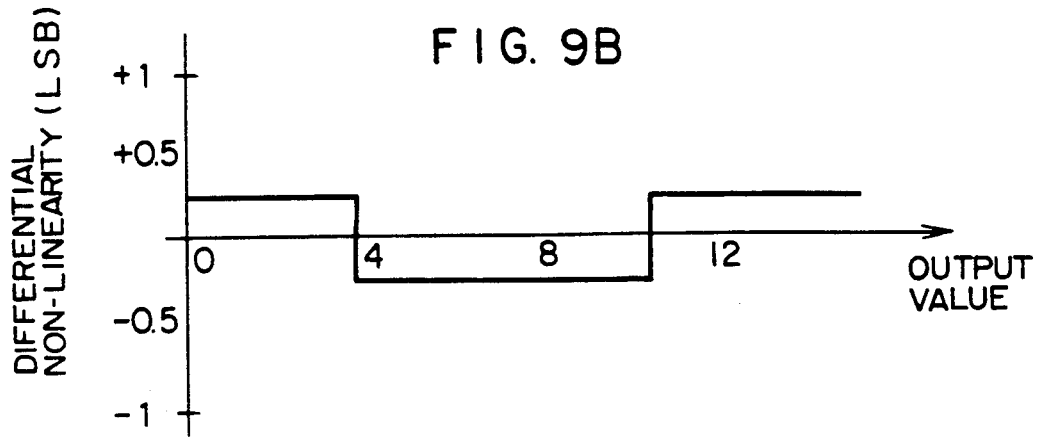

The fifth embodiment of the invention is shown in FIG. 6. This embodiment is designed to apply the A/D conversion method of the invention to a serial-parallel type A/D converter. In the present embodiment, an analogue input signal 1 is commonly applied to each one terminal of a first comparator chain 35. Each reference voltage generated in a first reference voltage generating means 3 is applied to each of the other terminals of the first comparator chain 35. The first comparator chain 35 serves to generate a chain of first comparing outputs. The first logic circuit 4 serves to convert the comparing outputs into respective digital codes and output the upper-digits of the converted output at output terminals 10. Likewise, an analogue input signal 1 is commonly applied to each one input terminal of a differential conversion circuit chain 36. Each reference voltage generated in the first reference voltage generating means 3 is inputted to each of the other input terminals of the differential conversion circuit chain 36. The differential conversion circuit chain 36 serves to convert the potential differences between the analogue input signal 1 and the respective reference voltages into respective differential currents. The differential currents are selectively supplied to a pair of load resistor chains 38 by a switching means 37 controlled by the comparing outputs of the first comparator chain 35. The second comparator chain 39 serves to compare the differential voltages outputted by the pair of the load resistor chains 38 with each other, generate the comparing outputs, and convert the outputs into respective digital codes in a second logic circuit 9. As a result, the second logic circuit 9 serves to output a lower-digits of the converted output at output terminals 10. FIG. 7 shows an analogue input, a differential output of the pair of load resistor chains 38, and a logic state of an essential portion of the present embodiment. In FIG. 7, Vr1 to Vr5 denote each reference voltage applied to the differential conversion circuit chain. An A/D converter according to this embodiment as shown is entirely different from the conventional one. That is, the conventional serial parallel type A/D converter shown in FIG. 2 serves to generate a comparing analogue signal corresponding to a first comparing output, generate a potential difference between the comparing analogue signal and the analogue input signal in a subtracter, and analogue-to-digital convert the potential difference into the lower-digits of the converted value in the second comparator chain, while the present serial-parallel type A/D converter includes the first comparator chain 35 and the differential conversion circuit chain 36 and is designed to selectively flow the output current of the differential conversion circuit chain 36 to a pair of load resistor chains 38 using a switching means controlled by the comparing output of the first comparator chain 35. It results in generating differential voltages having respective gain coefficients and comparing the magnitudes of the differential outputs with each other for providing the lower-digits of the converted value. Hence, the present serial-parallel type A/D converter can offer excellent differential non-linearity and carry out highly accurate A/D conversion. This will be described with reference to FIGS. 8 and 9. FIG. 8 shows the lower-digit converted value and the differential non-linearity assumed that the first reference voltage is departed from an idealized reference voltage because the accuracy of the first reference voltage is made inferior. In this instance, assuming that the reference voltage Vr2 is departed by +1 LSB and the reference voltage Vr3 is departed by −1 LSB, the differential non-linearity is made to be ±1 LSB. FIG. 9 shows the state of a differential output of load resistors and differential non-linearity assumed that this embodiment stays under the same condition of the prior art. The present embodiment, however, retains the differential non-linearity at ±0.25 LSB. The improvement of the linearity results from the fact that the present embodiment provides a function of evenly dividing an upper-digit reference voltage range without including the fixed unique lower-digit reference voltage, while the conventional serial parallel type A/D converter has the unique fixed reference voltage for lower digits and cannot correspond to the change of the reference voltage for upper digits. Further, the present embodiment includes a differential conversion circuit chain 36 and a pair of load resistor chains 38 for providing a gain to this circuit system, thereby relaxing the accuracy of the second comparator chain 9 and enhancing the accuracy more. The serial-parallel type A/D converter of this embodiment, therefore, is more easily designed to be highly accurate than the conventional serial-parallel type A/D converter.

Embodiment 6

Figure 10:
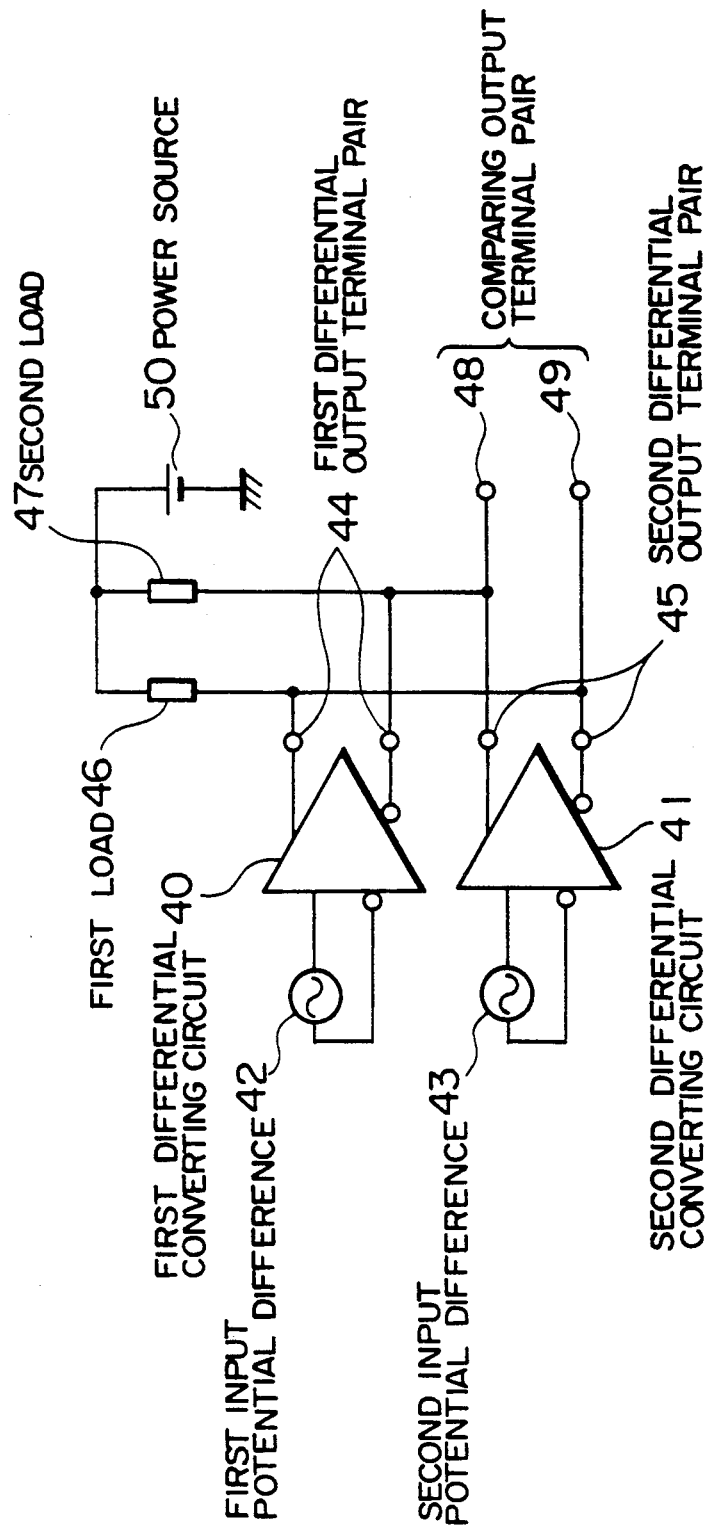
FIG. 10 is a schematic diagram showing a comparator circuit according to a sixth embodiment of the invention.

FIG. 10 shows a comparator circuit according to the sixth embodiment, which composes the second comparator chain shown in FIG. 6. As shown in FIG. 10, 40 and 41 denote a first and a second differential converting circuit, 44 and 45 denote a first and a second differential output terminal pairs, 42 and 43 denote a first and a second input potential differences, 46 and 47 denote a pair of loads, 48 and 49 denote a pair of comparing output terminals, and 50 denotes a power source required for the operations of those circuits. In FIG. 10, assuming that a first input potential difference 42 is $V_1$, a second input potential difference is $V_2$, a pair of currents flowing through the first differential output terminal pair 44 is $I_{11}$ and $I_{12}$, and a pair of currents flowing through the second differential output terminal pair 45 is $I_{21}$ and $I_{22}$, they can be represented by the following equations:

$$I_{11}=I_0(1+f(V_1)) \tag{8-A}$$

$$I_{12}=I_0(1-f(V_1)) \tag{8-B}$$

$$I_{21}=I_0(1+f(V_2)) \tag{8-C}$$

$$I_{22}=I_0(1-f(V_2)) \tag{8-D}$$

In the above equations, $I_0$ denotes a current constant of the first and the second differential circuits 40 and 41 and $f(V_1)$ and $f(V_2)$ denote non-dimensional monotone functions for converting the first input potential difference 42 and the second input potential difference 43 into respective current values. The monotone functions have the following quality which is peculiar to the differential circuit.

$$\lim_{x \to \infty} f(x) = 1 \tag{9-A}$$

$$\lim_{x \to -\infty} f(x) = -1 \tag{9-B}$$

$$f(0) = 0 \tag{9-C}$$

$$f(x) = -f(-x) \quad (9\text{-}D)$$

Assuming that $I_{41}$ denotes current flowing through the first load 46 and $I_{42}$ denotes current flowing through the second load 47, these currents are represented by the following equations:

$$I_{41} = I_{11} + I_{22} = I_0(2 + f(V_1) - f(V_1)) \quad (10\text{-}A)$$

$$I_{42} = I_{12} + I_{21} = I_0(2 + f(V_2) - f(V_1)) \quad (10\text{-}B)$$

Then, assuming that the resistance values of the first and the second loads are represented as R, a comparing output voltage $V_0$ appearing at a pair of comparing output terminals 48, 49 can be represented by the equation:

$$V_0 = R(I_{41} - I_{42}) = 2RI_0(f(V_1) - f(V_2)) \quad (11)$$

Hence, the polarity of the output voltage makes it possible to compare the first input potential difference $V_1$ with the second input potential difference $V_2$. Depending on the polarity, the following relations can be obtained:

$$V_0 > 0 \quad V_1 > V_2 \quad (12\text{-}A)$$

$$V_0 = 0 \quad V_1 = V_2 \quad (12\text{-}B)$$

$$V_0 < 0 \quad V_1 < V_2 \quad (12\text{-}C)$$

It is, therefore, possible to compare the magnitudes between respective two potential differences with each other.

It should be noted that, in case the A/D conversion method according to the invention is applied to the 3-bit A/D conversion, it is proper to design the embodiments 4 and 5 to have the following arrangement for the first and second loads and the pair of load resistor chains.

Figure 11:
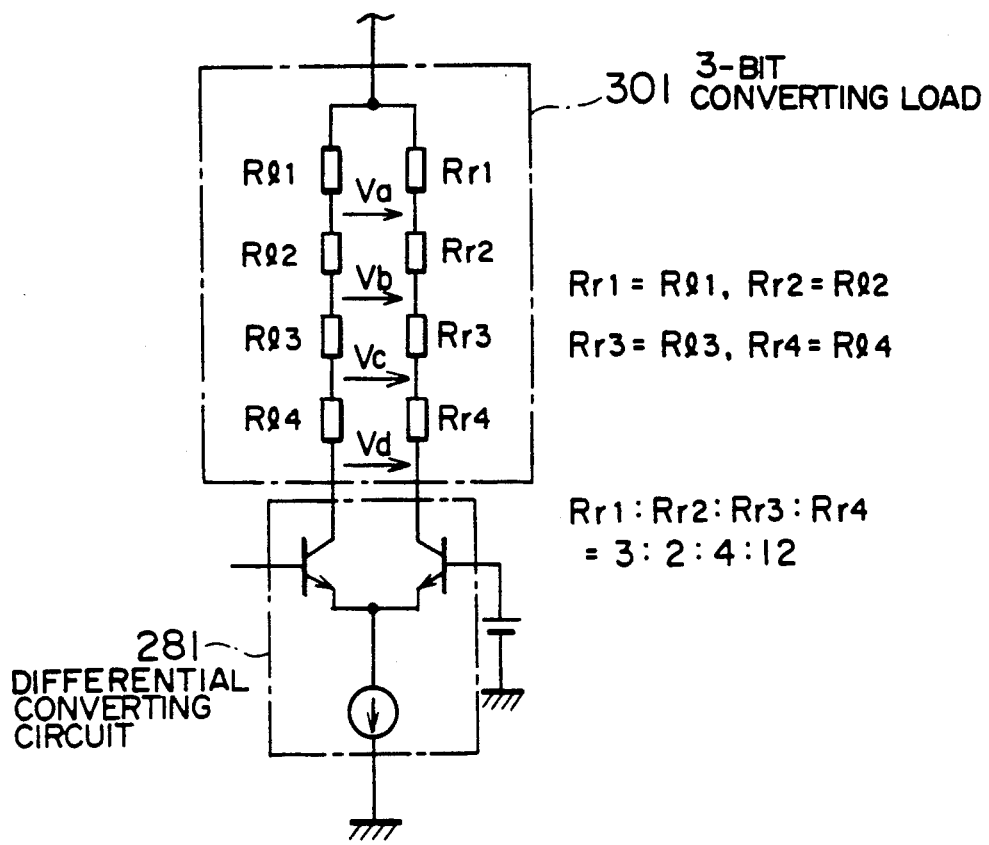
FIG. 11 is a schematic diagram showing a load resistor chain.

The resistors for a 3-bit converting load 301 are arranged, as shown in FIG. 11, so that $R_{r1}$, $R_{r2}$, $R_{r3}$, and $R_{r4}$ are disposed on one side, $R_{11}$, $R_{12}$, $R_{13}$, and $R_{14}$ are disposed on the other side, and the relationship of $R_{r1} = R_{11}$, $R_{r2} = R_{12}$, $R_{r3} = R_{13}$, and $R_{r4} = R_{14}$ are established. Assuming that $R_{r1}$ and $R_{11}$ are disposed on the end of the power source, $R_{r4}$ and $R_{14}$ are connected to the differential converting circuit 281, and those resistors are connected in the order of numerals, each resistance ratio can be set as shown in the formula 13:

$$R_{r1} : R_{r2} : R_{r3} : R_{r4} = 3:2:4:12 \quad (13\text{-}A)$$

$$R_{11} : R_{12} : R_{13} : R_{14} = 3:2:4:12 \quad (13\text{-}B)$$

Figure 12:
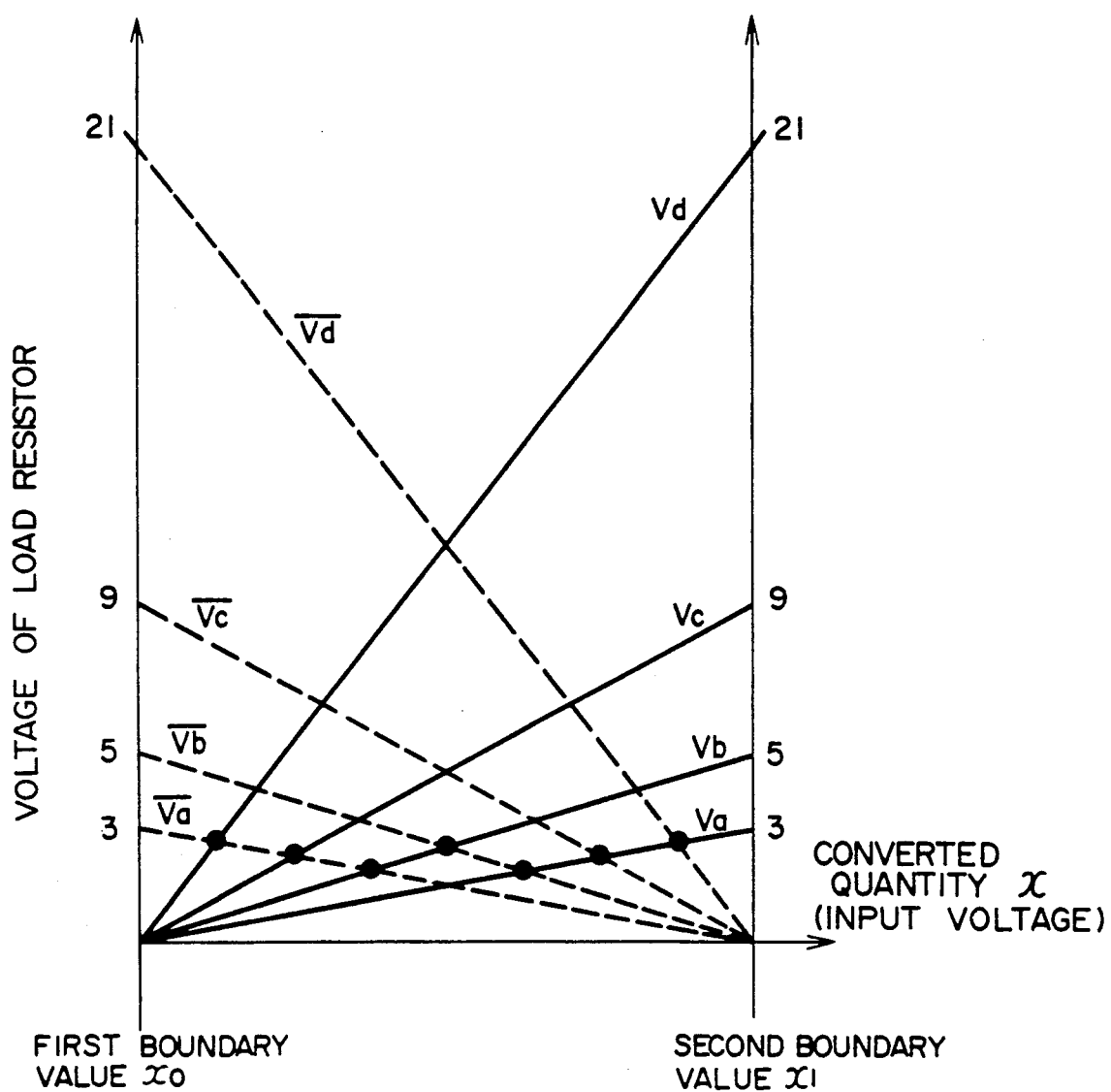
FIG. 12 is an explanation views showing a relationship between a converted quantity and voltages of lead resistors.

Then, assuming that an output voltage between a contact point of $R_{r1}$ and $R_{r2}$ and a contact point of $R_{11}$ and $R_{12}$ is defined as Va, an output voltage between a contact point of $R_{r2}$ and $R_{r3}$ and a contact point of $R_{12}$ and $R_{13}$ is defined as Vb, an output voltage between a contact point of $R_{r3}$ and $R_{r4}$ and a contact point of $R_{13}$ and $R_{14}$ is defined as Vc, an output voltage between a contact point of $R_{r4}$ and the differential converting circuit and a contact point of $R_{14}$ and the differential converting circuit is defined as Vd, and the corresponding complementary output voltages are respectively $\overline{Va}$, $\overline{Vb}$, $\overline{Vc}$, $\overline{Vd}$, those voltages are indicated with respect to a converted quantity or an input voltage as shown in FIG. 12. Each cross point of an output voltage and a complementary output voltage, indicated by a large dot, divides the interval between the first boundary value $X_0$ and the second boundary value $x_1$ into eight. It is easy to set the resistance ratio because it is an integral ratio. Also, the comparators provide a substantially constant sensitivity, because the cross point is distributed on the substantially same voltage potential in the load resistors.

As set forth above, (1) the A/D conversion method is provided to define a region placed between a first boundary value and a second boundary value as a reference range and to compare a physical quantity, which is produced by multiplying a difference between the first boundary value and a quantity to be A/D converted by a first coefficient, with another physical quantity, which is produced by a difference between the second boundary value and the quantity to be A/D converted by a second coefficient, for the purpose of providing a converted digital value. Unlike the conventional A/D conversion method, hence, the present method makes it possible to use as a reference value a middle value of the region placed between the first boundary value and the second boundary value without having to divide the region placed between the first boundary value and the second boundary value in advance and to form a reference value. (2) The A/D conversion method is provided to define a region placed between a first boundary value and a second boundary value as a reference range and compare a plurality of physical quantities, which are produced by multiplying a difference between the first boundary value and a quantity to be A/D converted by a chain of first coefficients, with another plurality of physical quantities, which are produced by multiplying a difference between the second boundary value and the quantity to be A/D converted by a chain of second coefficients, for the purpose of providing a converted digital value. Unlike the conventional A/D conversion method, hence, the present method makes it possible to use as reference values a plurality of middle values in the region placed between the first and the second boundary values for implementing high resolution of the A/D conversion without having to divide the region placed between the first foundary value and the second boundary value in advance and to form a reference value. (3) The use of the differential converting circuit or a plurality of differential converting circuit having respective amplification factors makes it possible to implement an A/D conversion device embodying the A/D conversion method according to (1) and (2). (4) The A/D conversion device employs the differential conversion circuit for converting a potential difference between a reference voltage and an input analogue voltage into a differential current and a pair of load resistor chains served as the load of the differential current and having one or more resistors connected in series. A pair of load resistor chains having one or more resistors connected in series are enabled to pass the same current, thereby the output voltage with the amplification factor given in proportion to the resistances of the load resistors being provided. The use of this simple construction thus makes it possible to implement an A/D converting device embodying the A/D converting method according to (1) and (2). (5) A serial-parallel type A/d converter can be arranged by a plurality of differential converting circuits and a switching means for selectively supplying the output currents of those differential converting circuits into the first pair of load resistors and the second pair of load resistors.

The serial-parallel type A/D converter has far less circuit scale and power consumption than the parallel type A/D converter. Also, since the circuit system has a gain by having a larger load resistance, the requirement for an accuracy of the second comparator circuit is relaxed, thereby achieving high accuracy. In addition, unlike the conventional serial-parallel type A/D converter, the present invention does not include a fixed reference voltage and divides a lower-digit reference voltage range at a given ratio for forming each reference voltage of the lower-digit comparators. Even if, hence, an upper-digit reference voltage range is varied according to an offset voltage error of the differential converting circuit, the resulting A/D conversion device can achieve excellent small differential non-linearity and high accuracy. (6) The lower-digit comparator used in the A/D conversion device serves to describe the differential currents of the first and the second differential converting circuits with monotone functions of the first and the second input potential differences and to supply both the first and second differential currents to a pair of loads. Hence, the differential currents are linearly added, resulting in the comparing output becoming opposite in its polarity at a ratio given between the first input potential difference and the second input potential difference.

We claim:

1. An analog-to-digital conversion method comprising the steps of:

defining a first boundary value and a second boundary value such that a quantity to be analog-to-digital converted resides between said first boundary value and said second boundary value;

multiplying a difference between said first boundary value and said quantity to be analog-to-digital converted by a first chain of coefficients to produce at least one first physical quantity;

multiplying a difference between said second boundary value and said quantity to be converted by a second chain of coefficients to produce at least one second physical quantity;

comparing said at least one first physical quantity with said at least one second physical quantity to obtain at least one comparison result, said comparing step being performed independently from said quantity to be converted; and logically converting said at least one comparison result into a digital value.

2. An analog-to-digital conversion device comprising:

a first differential converting circuit for generating a plurality of output voltages, which are produced by multiplying a potential difference between a first reference voltage and an input analogue voltage by a chain of first coefficients;

a second differential converting circuit for generating a plurality of output voltages, which are produced by multiplying a potential difference between a second reference voltage and said input analogue voltage by a chain of second coefficients; and a plurality of comparator circuits for comparing a plurality of output voltages of said first differential converting circuit and a plurality of output voltages of said second differential converting circuit, said comparing being performed independently from said input analogue voltage, and the comparing outputs of said comparator circuits being logically converted into a digital value.

3. An analog-to-digital conversion device comprising:

a first differential converting circuit for converting a potential difference between a first reference voltage and an input analogue voltage into a first differential current;

a first pair of load resistor chains serving as a load of the first differential current, each of the chains having a plurality of resistors connected in series, a second differential converting circuit for converting a potential difference between a second reference voltage and said input analogue voltage into a second differential current;

a second pair of load resistor chains serving as a load of the second differential current, each of the chains having a plurality of resistors connected in series; and a computer circuit for comparing, independently from said input analogue signal, a plurality of potential differences between a plurality of taps of said first pair of load resistor chains with a plurality of potential differences between a plurality of taps of said second pair of load resistor chains, the comparing outputs of said comparator circuit being logically converted into digital value.

4. An analog-to-digital conversion device comprising:

a reference voltage generating means for generating a plurality of reference voltages having a given order of magnitudes;

a plurality of differential converting circuits arranged in accordance with said order of the magnitudes of said reference voltages and each having a first input terminal connected to a corresponding one of said reference voltages and a second input terminal connected to an analogue input signal in common, the potential difference between said first and second input terminals of each of said differential converting circuits being converted to provide respective differential pairs of output currents;

a first pair of load resistor chains and a second pair of load resistor chains, each chain having a plurality of resistors connected in series , and each pair of said load resistor chains serving as a pair of loads on each of said differential pair of currents;

a first comparator circuit chain for comparing said analogue input signal with said plurality of reference voltages;

a switching means for selectively supplying the output currents of specific even-numbered ones of said differential converting circuits and the output currents of the adjacent odd-numbered ones of said differential converting circuits to the first and the second pairs of said load resistor chains depending on a comparison output of said first comparator circuit; and a second comparator circuit chain for comparing, independently form said analogue input signal, a plurality of potential differences between a plurality of taps of said first pair of load resistor chains with a plurality of potential differences between a plurality of taps of said second pair of load resistor chains, wherein the comparison outputs of said first comparator circuit chain and the second comparator circuit chain are logically converted into a digital value.

5. A comparator circuit comprising:

a first differential converting circuit for converting a first input potential difference into a first differential current;

a second differential converting circuit for converting a second input potential difference into a second differential current; and said first and second differential currents being supplied into a pair of loads for generating a comparing output according to the magnitude of a difference between said first and second input potential differences.

6. An analog-to-digital conversion device comprising:

a first differential converting circuit for converting a potential difference between a first reference voltage and an input analogue voltage into a first differential current;

a first pair of load resistor chains serving as a load of the first differential current, each of the chains having a plurality of resistors connected in series, a second differential converting circuit for converting a potential difference between a second reference voltage and said input analogue voltage into a second differential current;

a second pair of load resistor chains serving as a load of the second differential current, each of the chains having a plurality of resistors connected in series; and a comparator circuit for comparing a plurality of potential differences between a plurality of taps of said first pair of load resistor chains with a plurality of potential differences between a plurality of taps of said second pair of load resistor chains, the comparing outputs of said comparator circuit being logically converted into digital value, wherein the first and the second pairs of load resistor chains are respectively composed of four resistors connected in series and a resistance ratio thereof is arranged as 3:2:4:12.

7. The analog-to-digital conversion device comprising:

a reference voltage generating means for generating a plurality of reference voltages having a given order of magnitudes;

a plurality of differential converting circuits arranged in accordance with said order of the magnitudes of said reference voltages and each having a first input terminal connected to a corresponding one of said reference voltages and a second input terminal connected to an analogue input signal in common, the potential difference between said first and second input terminals of each of said differential converting circuits being converted to provide respective differential pairs of output currents;

a first pair of load resistor chains and a second pair of load resistor chains, each chain having a plurality of resistors connected in series, and each pair of said load resistor chains serving as a pair of loads on each of said differential pair of currents;

a first comparator circuit chain for comparing said analogue input signal with said plurality of reference voltages;

a switching means for selectively supplying the output currents of specific even-numbered ones of said differential converting circuits and the output currents of the adjacent odd-numbered ones of said differential converting circuits to the first and the second pairs of said load resistor chains depending on a comparison output of said first comparator circuit; and a second comparator circuit chain for comparing a plurality of potential differences between a plurality of taps of said first pair of load resistor chains with a plurality of potential differences between a plurality of taps of said second pair of load resistor chains, wherein the comparison outputs of said first comparator circuit chain and the second comparator circuit chain are logically converted into a digital value, wherein the first and the second load resistor chains respectively include four resistors and a resistance ratio thereof is arranged as 3:2:4:12.

* * * * *